(12) United States Patent
Xhakoni et al.

(10) Patent No.: US 10,804,916 B2
(45) Date of Patent: Oct. 13, 2020

(54) ANALOG-TO-DIGITAL CONVERTER CIRCUIT AND METHOD FOR ANALOG-TO-DIGITAL CONVERSION

(71) Applicant: ams AG, Premstaetten (AT)

(72) Inventors: Adi Xhakoni, Kessel Lo (BE); Koen Ruythooren, Hever (BE)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/494,829

(22) PCT Filed: Mar. 16, 2018

(86) PCT No.: PCT/EP2018/056636
§ 371 (c)(1),
(2) Date: Sep. 17, 2019

(87) PCT Pub. No.: WO2018/177773
PCT Pub. Date: Oct. 4, 2018

(65) Prior Publication Data
US 2020/0044660 A1 Feb. 6, 2020

(30) Foreign Application Priority Data
Mar. 30, 2017 (EP) .................................... 17163884

(51) Int. Cl.
*H03M 1/12* (2006.01)
*H03M 1/06* (2006.01)
(Continued)

(52) U.S. Cl.
CPC ....... *H03M 1/0617* (2013.01); *H03M 1/1245* (2013.01); *H03M 1/56* (2013.01);
(Continued)

(58) Field of Classification Search
CPC ............ H03M 1/12; H03M 1/56; H03M 1/00; H04N 3/1506; H01L 27/14609; H01L 27/00
(Continued)

(56) References Cited

U.S. PATENT DOCUMENTS 3,623,073 A 11/1971 Wheable et al.
3,733,600 A 5/1973 Hellwarth et al.
(Continued)

FOREIGN PATENT DOCUMENTS

EP 2109223 10/2009

OTHER PUBLICATIONS

European Patent Office, International Search Report for PCT/EP2018/056636, dated Jun. 12, 2018.
(Continued)

*Primary Examiner* — Joseph J Lauture
(74) *Attorney, Agent, or Firm* — Fish & Richardson P.C.

(57) ABSTRACT

In one embodiment an analog-to-digital converter circuit has an input for receiving a first analog signal level and a second analog signal level, a ramp generator adapted to provide a ramp signal, a comparison unit coupled to the input and the ramp generator, a control unit coupled to the comparison unit the control unit having a counter, the control unit being prepared to enable the counter as a function of a comparison of the ramp signal with the first analog signal level and the second analog signal level, and an output for providing an output digital value as a function of a relationship between the first analog signal level and the second analog signal level. Therein the ramp signal has at least one linearly rising and at least one linearly falling portion and an adjustable shift at a reversal point between the rising and the falling portion of the ramp signal, the shift depending on the number of rising and falling portions of the ramp signal.

12 Claims, 7 Drawing Sheets

(51) Int. Cl.
*H03M 1/56* (2006.01)
*H01L 27/00* (2006.01)
*H04N 3/14* (2006.01)
*H03M 1/00* (2006.01)
*H01L 27/146* (2006.01)

(52) U.S. Cl.
CPC ........ *H01L 27/00* (2013.01); *H01L 27/14609* (2013.01); *H03M 1/00* (2013.01); *H03M 1/12* (2013.01); *H04N 3/1506* (2013.01)

(58) Field of Classification Search
USPC ........ 341/155, 169, 164, 165; 348/302, 308; 250/208.1
See application file for complete search history.

(56) References Cited

U.S. PATENT DOCUMENTS

| | | | |
|---|---|---|---|
| 5,321,403 | A | 6/1994 | Eng, Jr. et al. |
| 5,565,869 | A | 10/1996 | Brodie et al. |
| 2009/0066554 | A1 | 3/2009 | Lim |
| 2011/0304755 | A1 | 12/2011 | Kondo |
| 2014/0361916 | A1* | 12/2014 | Wolfs ................ H03M 1/0617 341/155 |
| 2015/0042859 | A1 | 2/2015 | Lee et al. |

OTHER PUBLICATIONS

Kim et al., "A High Speed CMOS Image Sensor with a Novel Digital Correlated Double Sampling and a Differential.Difference Amplifier", Sensors 15:5081-5098 (2015).

* cited by examiner

ANALOG-TO-DIGITAL CONVERTER CIRCUIT AND METHOD FOR ANALOG-TO-DIGITAL CONVERSION

BACKGROUND

The field of this application concerns analog-to-digital converters, ADCs, especially, ADCs using a ramp signal for the conversion. Such converters are called ramp ADCs.

Ramp ADCs are widely used for example in image sensors due to their compact size and simplicity, allowing them to easily perform multiple conversions in parallel. Therefore, these ADCs are typically used in a column of pixels for the conversion of a full row of pixels within a single conversion cycle.

One problem with existing ramp ADCs is their slow conversion time, i.e. long conversion cycle. The conversion cycle denotes the time needed for an ADC to provide a digital output equivalent to an analog input. A conversion with the resolution of N bits performed by a state of the art converter typically requires 2 to the power of N clock cycles of the clock used within the converter. Additionally, for most applications, a reference level is also converted, meaning that two ramps are needed for the conversion of two analog values or levels in order to provide a single converted, i.e. digital value.

To avoid various column-to-column non-uniformities, all column ADCs share the same ramp voltage or ramp signal generated by a ramp generator. It follows that a ramp generator which provides the ramp voltage is loaded with a very large capacitance which is usually proportional to the number of columns of an image sensor. Furthermore, to avoid kickback to the ramp from the toggling of comparators used in the ADC, a ramp load capacitance must be properly sized, i.e. further increased.

Each time a conversion is performed, the ramp signal used in state of the art ADCs must be reset to a well-defined value, corresponding to one of the limits of an ADC's input swing. With the ever increasing speed of the ramp ADCs, the ramp-reset time is becoming an important fraction of the total conversion time. Furthermore, as the trend in imaging is higher resolution, the dead time caused by the ramp reset becomes even larger as the ramp generator's load increases proportionally to the number of columns of the array.

The definitions as described above also apply to the following description unless stated otherwise.

SUMMARY

In one embodiment an analog-to-digital converter, ADC, circuit has an input for receiving a first analog signal level and a second analog signal level, a ramp generator adapted to provide a ramp signal, a comparison unit coupled to the input and to the ramp generator, and a control unit coupled to the comparison unit. The control unit has a counter. The control unit is prepared to enable the counter as a function of a comparison of the ramp signal with the first analog signal level and the second analog signal level. The circuit further has an output for providing an output digital value as a function of a relationship between the first analog signal level and the second analog signal level. Therein the ramp signal has at least one linearly rising and at least one linearly falling portion and an adjustable shift at a reversal point between the rising and falling portion. The shift depends on the number of rising and falling portions of the ramp signal.

A first and a second analog signal level are supplied to the input of the ADC circuit. Therein, the first analog signal level represents, for example, a reference voltage and the second analog signal level represents a signal voltage, for example, or vice versa. In case the ADC circuit is used in an image sensor, the first analog signal level may comprise a voltage representing a reset or dark level of a pixel and the second analog signal level may comprise a voltage representing a light level or signal level of the pixel. The comparison unit compares a respective level of the first and the second analog signal level to the gradually changing ramp signal. The control unit enables the counter as soon as the ramp signal reaches the value of the first or the second analog signal level. The control unit derives the output digital value from the counter, such that the output digital value corresponds to the relationship between the first and the second analog signal levels. The relationship may represent a difference between or a ratio of the first and the second analog signal levels.

The use of the ramp signal with linearly rising and falling portions and the adjustable shift at the reversal point between the rising and falling portion eliminates the dead time of the ramp reset operation of ADCs in the state of the art while increasing the achievable resolution of the ADC, for example by one bit, due to the shift. In other words, as the ramp signal reaches its initial state at the end of each conversion, or during the conversion if it is performed sequentially, a ramp reset is avoided. By way of the shift, a noise oversampling is achieved without any time penalty.

In a development the shift at the reversal point between the rising and the falling portion of the ramp signal is realized by a delay during which the ramp signal remains at an essentially constant level. Furthermore, a gradient of the rising portion is substantially equal to a gradient of the falling portion of the ramp signal.

Therein the delay refers to a delay in time.

In a further development the ADC circuit is operable in one of three modes, wherein in a first mode a conversion cycle comprises at least two linearly rising portions and at least two linearly falling portions of the ramp signal and a sequential comparison of the first analog signal level with the ramp signal and the second analog signal level with the ramp signal; in a second mode a conversion cycle comprises one linearly rising portion and one linearly falling portion of the ramp signal and a concurrent comparison of the first analog signal level and the second analog signal level with the ramp signal; and in a third mode a conversion cycle comprises one linearly rising portion or one linearly falling portion of the ramp signal and a concurrent comparison of the first analog signal level and the second analog signal level with the ramp signal and a subsequent conversion cycle starts at the reversal point of the rising or falling portion of the ramp signal after the shift.

For a concurrent comparison of the first and the second analog signal level with the ramp signal the comparison unit comprises for instance two comparators, wherein each comparator receives the ramp signal at one of its inputs and receives either the first or the second analog signal level on the respective other input. For a sequential comparison of the first and the second analog signal level with the ramp signal the comparison unit comprises just one comparator which receives the ramp signal at one of its inputs and receives the first analog signal level at its respective other input during a first phase of a conversion cycle and the second analog signal level during a second phase of the conversion cycle. In the second mode with the concurrent comparison of first and second analog signal levels with the ramp signal, the output digital value is directly provided by the control unit as the difference between first and second analog signal level.

In one embodiment in the first mode and in the second mode in which the ADC circuit is operable a conversion cycle comprises a number of N linearly rising portions and N linearly falling portions of the ramp signal. Therein N is an even integer, and the shift is a function of the reciprocal value of the number N. The shift is additionally inserted at the reversal point between the falling and the rising portion of the ramp signal.

Consequently, in the first mode a minimum of two linearly rising and falling portions of the ramp signal are employed with a shift at each reversal point. For example, the first rising and subsequent falling portion of the ramp signal is used for a comparison and conversion of the first analog signal level corresponding, for instance, to the reset level of a signal of an image sensor, and subsequently the second rising and falling portions of the ramp signal are employed for the comparison and conversion of the second analog signal level representing for instance the signal level of a signal supplied from an image sensor. A ramp shift is performed at each switching or reversal point between the rising and the falling portion. Thereby, an extra bit of resolution is realized. Therefore, the proposed ADC circuit achieves the same resolution as a single slope steepness ADC of the state of the art with the advantage of not requiring a ramp reset operation.

In a development the ADC circuit comprises another input for receiving a main clock signal which is used by the counter. The shift of the ramp signal is a function of a phase shift of the ramp signal with respect to the main clock signal, or the shift of the ramp signal is a function of a phase shift of the main clock signal.

The shift may be realized by shifting the phase of the ramp signal with respect to a phase of the main clock signal. Alternatively, the shift of the ramp signal is realized by phase shifting the main clock signal. For example, in the first mode of the ADC circuit, when the conversion cycle comprises two linearly rising and two falling portions of the ramp signal, the shift at each reversal point amounts to half a clock period of the main clock signal. If in this mode N rising and N falling portions or slopes are used, the shift at each switching point between the rising and the falling slope and the shift at each switching point between the falling and the rising slope is adjusted to the reciprocal value of N clock periods of the main clock. Because of the fact that N is an even number, ramp reset operations are avoided. An oversampling of N is achieved.

In a development the control unit further comprises a processing unit which is prepared to calculate the output digital value as a function of a counting signal provided by the counter.

In case of a sequential comparison of the first and the second analog signal level with the ramp signal the counter is enabled and disabled twice by the control unit. In each case a corresponding counting signal is provided. The processing unit calculates the output digital value as the difference or the sum of the counting signals. The counter, for example, is incremented in synchronism with the ramp signal and the main clock signal. The counting signal therefore provides a digital representation of the current analog value of the ramp signal at any point in time.

In a development the ramp generator is additionally adapted to derive a secondary clock signal from the main clock signal. The secondary clock signal has a frequency which is an integer multiple of a frequency of the main clock signal, the integer multiple being a function of the adjustable shift of the ramp signal.

Consequently, if a shift of half a clock period of the main clock signal is to be realized, the secondary clock signal will have a frequency which is twice the frequency of the main clock signal. In this example in the first mode, the ramp signal has two rising and two falling portions.

In one embodiment a method for analog-to-digital conversion comprises the following steps:
supplying a first analog signal level and a second analog signal level,
generating a ramp signal,
comparing the ramp signal with the first analog signal level and the second analog signal level,
enabling a counting in function of the comparing the ramp signal with the first analog signal level and the second analog signal level, and
providing an output digital value as a function of a relationship between the first analog signal level and the second analog signal level,
wherein the ramp signal has at least a linearly rising and a linearly falling portion and an adjustable shift at a reversal point between the rising and falling portion of the ramp signal, the shift depending on the number of rising and falling portions of the ramp signal.

The method for analog-to-digital conversion may be implemented for example by the analog-to-digital converter circuit according to one of the embodiments defined above. By employing the ramp signal with at least one linearly rising and at least one linearly falling portion and the adjustable shift the proposed method eliminates the need for a reset of the ramp signal as in the state of the art analog-to-digital conversions. The speed of the conversion is increased while power consumption is reduced.

In further developments the step of comparing the ramp signal with the first analog signal level and the second analog signal level is performed sequentially or, alternatively, it is performed concurrently.

In further developments of the method the conversion is performed in one of the three modes described above with reference to the ADC circuit.

At the end of each conversion cycle the output digital value is provided.

BRIEF DESCRIPTION OF THE DRAWINGS

The text below explains the proposed ADC circuit and corresponding method in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

FIGS. 1b and 1c each show exemplary timing diagrams for the proposed ADC circuit of FIG. 1a;

FIGS. 4b and 4c each show exemplary timing diagrams for the proposed ADC circuit of FIG. 4a;

FIGS. 5a and 5b each show exemplary timing diagrams for the proposed ADC circuit of FIG. 4a;

FIG. 6b shows exemplary timing diagrams for the ramp generator of FIG. 6a.

DETAILED DESCRIPTION

Figure 1A:
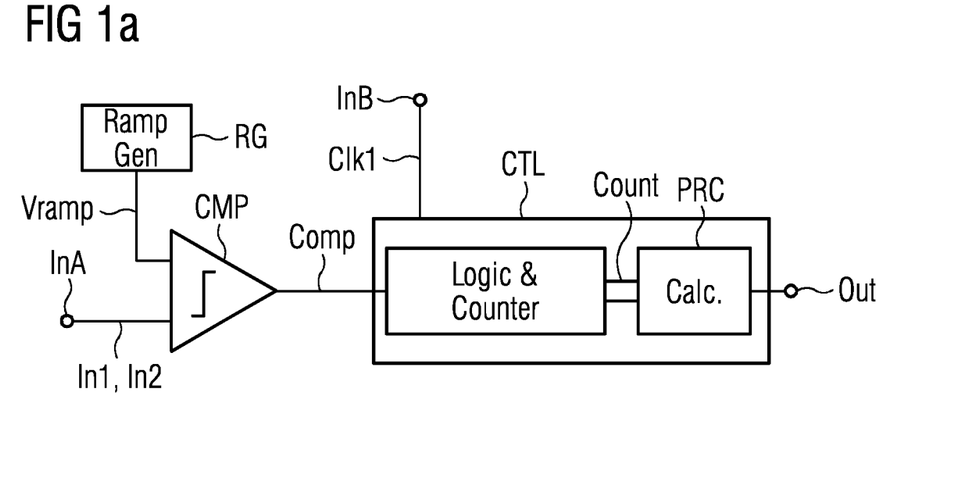
FIG. 1a shows a first embodiment example of the proposed ADC circuit.

FIG. 1a shows a first embodiment example of the proposed ADC circuit. The ADC circuit has an input InA for receiving a first analog signal level In1 and a second analog signal In2. The ADC circuit further has a ramp generator RG for providing a ramp signal Vramp, a comparison unit CMP which is coupled to the input InA and to the ramp generator RG and a control unit CTL which is coupled to the comparison unit CMP. The control unit CTL has an output Out which forms the output of the ADC circuit at which an output digital value is provided. The control unit CTL has a counter.

The first analog signal level In1 represents for example a reset level or dark level of a pixel in an image sensor, while the second analog signal level In2 corresponds to a signal voltage of said pixel of the image sensor. Both signals may be provided as a voltage.

First and second analog signal levels In1, In2 are compared to the ramp signal Vramp in the comparison unit CMP. For this purpose the comparison unit CMP in this embodiment has one comparator which provides a comparison signal Comp. The control unit CTL enables the counter depending on the comparison performed in the comparison unit CMP and provides the output digital value reflecting a relationship between the first analog signal level In1 and the second analog signal level In2.

The ADC circuit further has another input InB for receiving a main clock signal Clk1. This main clock signal Clk1 is used, amongst others, by the counter of the control unit CTL in order to provide a counting signal Count. The control unit CTL further comprises a processing unit PRC which is prepared to calculate the output digital value as a function of the counting signal Count. The main clock signal Clk1 may have a frequency of about 1 GHz.

The ADC circuit according to the embodiment of FIG. 1a is operated in the first mode defined above. Detailed operation of the ADC circuit is explained in the following with reference to FIGS. 1b and 1c.

Figure 1B:
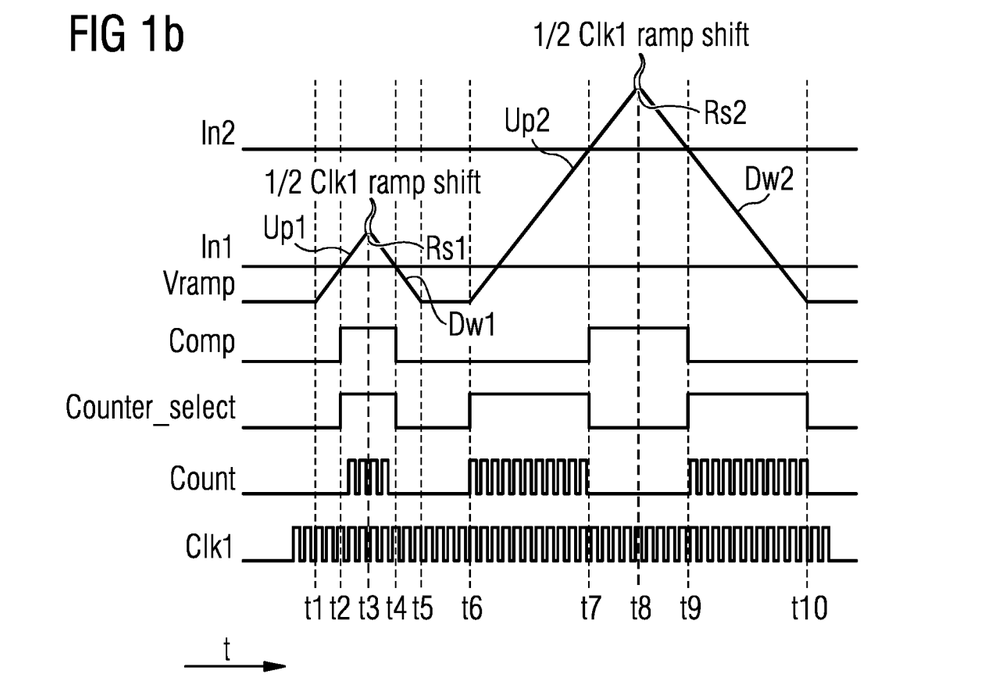

FIG. 1b shows exemplary timing diagrams for the proposed ADC circuit of FIG. 1a. Each line depicts the course of one signal with respect to time t. From top to bottom the following signals are shown: The second analog signal level In2, the first analog signal level In1, the ramp signal Vramp, the comparison signal Comp, an enable signal Counter_select, the counting signal Count and the main clock signal Clk1. The signal Counter_select is a control signal generated inside the control unit CTL of FIG. 1a by way of which the control unit CTL enables the counter.

It can be discerned that the ramp signal Vramp has a first linearly rising portion Up1 from point in time t1 to point in time t3 which is followed by a first shift Rs1 taking place at point in time t3. The ramp signal continues with a first linearly falling portion Dw1 which ends at point in time t5. At point in time t6 the ramp signal Vramp starts rising again with a second linearly rising portion Up2 until the point in time t8 at which a second shift Rs2 takes place. Subsequently, the ramp signal Vramp has a second linearly falling portion Dw2 which ends at point in time t10. First and second shifts Rs1, Rs2 of the ramp signal Vramp are adjusted in this example to a duration of half a period of the main clock signal Clk1 because the ramp signal Vramp has two rising portions Up1, Up2 and two falling portions Dw1, Dw2.

The conversion of the first and the second analog signal level In1, In2 is performed by sequentially comparing the first and the second analog signal level In1, In2 to the ramp signal Vramp and providing the resulting comparing signal Comp. Initially the first analog signal level In1 is supplied to the input InA. As soon as the ramp signal Vramp reaches the level of the first analog signal level In1 at point in time t2, the output of the comparing unit CMP toggles and the comparing signal Comp changes its state. In this example, the comparing signal Comp changes its state from low to high. In response to this, the control unit CTL enables the counter through a high level of the signal Counter_select. The counting signal Count counts the number of clocks of the main clock signal Clk1 until the point in time t4. At this point in time the first falling portion Dw1 of the ramp signal Vramp reaches the level of the first analog signal level In1 and the output of the comparator CMP toggles again. The comparing signal Comp changes its state, e.g. from high to low and the control unit CTL disables the counter by changing the state of the Counter_select signal to low.

For the subsequent conversion of the second analog signal level In2 said signal is supplied to the input InA and compared with the ramp signal Vramp from point in time t6 onwards. For this, the counter is activated by setting the Counter_select signal to high at point in time t6 so that the counting signal Count determines the number of clocks of the main clock signal Clk1 until the ramp signal Vramp crosses the level of the second analog signal level In2 at point in time t7. The output of the comparator of the comparing unit CMP toggles and the comparing signal Comp changes its state, e.g. from low to high. The counter is deactivated by a low level of the Counter_select signal and stops counting. At point in time t9 where the second falling portion Dw2 of the ramp signal Vramp reaches the level of the second analog signal level In2 the comparator's output toggles again and the comparing signal Comp changes its state, e.g. from high to low level. In response to this the counter is enabled by the Counter_select signal and the counting signal Count determines the number of clocks of the main clock signal Clk1 until the second falling portion Dw2 of the ramp signal Vramp reaches its initial value of the start of the conversion at point in time t1 and consequently ends at point in time t10.

In this example the output digital value is provided as a sum of the clocks determined with the counting signal Count during conversion of the first analog signal level In1 and the second analog signal level In2.

In this embodiment a full conversion cycle extends between the point in time t1 and the point in time t10 at which the output digital value is provided.

It can be seen that a reset of the ramp signal Vramp as in state of the art implementations is avoided by using the specified ramp signal Vramp with first and second rising portions Up1, Up2 and first and second falling portions Dw1, Dw2. This greatly increases the speed of the conversion and reduces the power consumption of the ADC circuit. Also, a fast and low noise ramp reset buffer, like in state of the art implementations, is no longer necessary which further reduces power consumption.

Figure 1C:
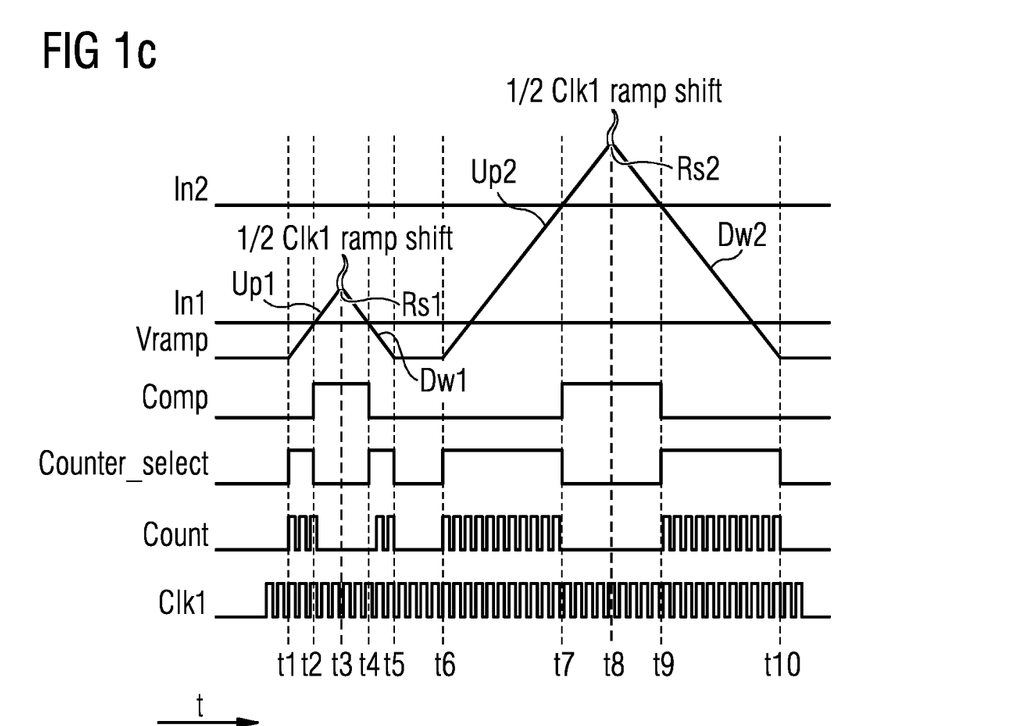

FIG. 1c shows other exemplary timing diagrams for the proposed ADC circuit of FIG. 1a. The timing diagrams of FIG. 1c correspond to the diagrams of FIG. 1b. However, in FIG. 1c the output digital value is provided as the difference between the first and the second analog signal level In1, In2 and consequently the enabling of the counter differs from the one depicted in FIG. 1b.

In detail, the counter is enabled by the Counter_select signal at point in time t1 when the conversion of the first analog signal level In1 starts. The number of clocks of the main clock signal Clk1 until the ramp signal Vramp reaches the level of the first analog signal In1 at point in time t2 is provided with the counting signal Count. When the output of the comparator CMP toggles as reflected in the comparing signal Comp at point in time t2, the counter is deactivated by the Counter_select signal. As soon as the ramp signal again reaches the level of the first analog signal level In1 at point in time t4, the comparing signal Comp changes its state to low and in response to this the counter is activated with a high level of the Counter_select signal. The counting signal Count provides the number of clocks of the main clock signal Clk1 until the ramp signal Vramp reaches its initial level, i.e. the level at point in time t1, at point in time t5. The conversion of the second analog signal level In2 between point in time t6 and point in time t10 complies with the conversion of the second analog signal level In2 between point in time t6 and t10 described above with reference to FIG. 1b.

The output digital value is provided at point in time t10 at the end of the conversion cycle as the difference between the counts of the main clock signal Clk1 determined with the counting signal Count during conversion of the second analog signal level In2 and the counts determined by the counting signal Count during conversion of the first analog signal level In1. In other words, the result of the conversion of the reset signal In1 reflected in the counting signal Count is subtracted from the result of the conversion of the signal level In2 reflected in the counting signal Count.

It is to be noted that first and second rising portions Up1, Up2 of the ramp signal Vramp start at the same phase of the main clock signal Clk1.

In analogy to the description of FIG. 1b, also the realization of FIG. 1c enables avoiding a reset of the ramp signal Vramp. Consequently, no high power reset for the ramp signal Vramp is needed anywhere before, during or after the conversion cycle. A further benefit of the proposed ADC circuit is that an oversampling of the noise of a factor of two is achieved because the comparator toggles twice for the same signal. This reduces the temporal noise of the ADC circuit and of preceding readout stages.

Figures 2A, 2B:
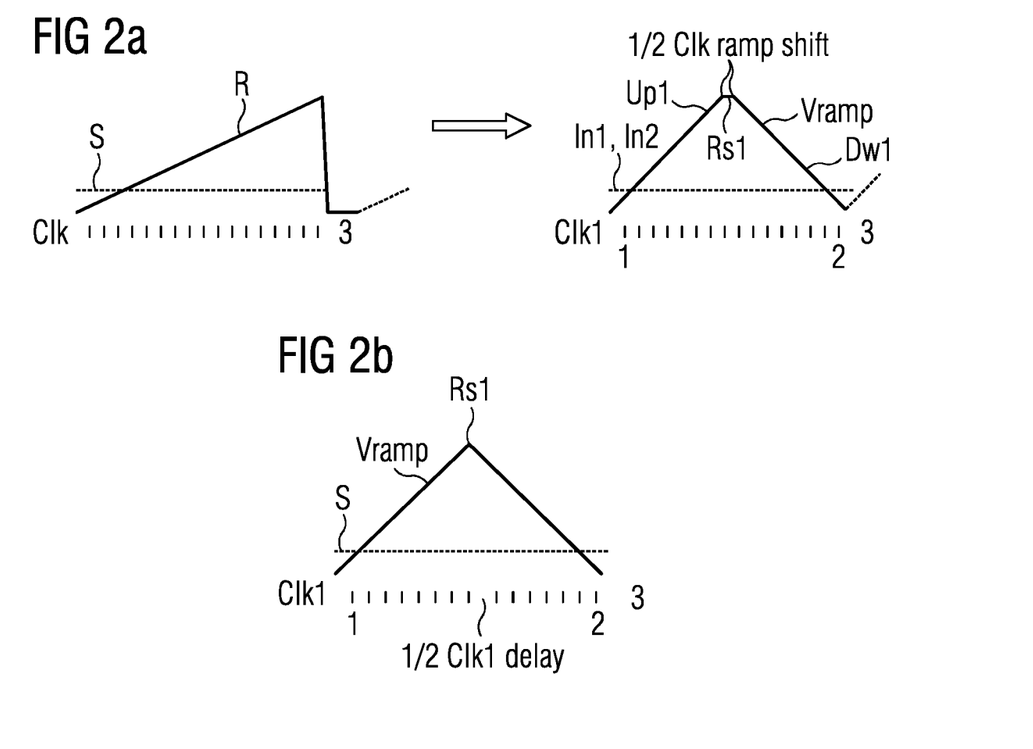
FIGS. 2a and 2b each show details of ramp signals.

FIG. 2a shows details of ramp signals. On the left side a ramp signal R used in state of the art implementations is depicted. When a signal S is applied to the input of a conventional converter, three clocks of the clock signal Clk are counted in the conventional ramp ADC.

On the right side the ramp signal Vramp having at least one linearly rising portion Up1 and at least one linearly falling portion Dw1 and the shift RS1 as defined in this application is shown. One clock cycle of the main clock Clk1 is counted during the rising slope Up1 and two clocks of the main clock signal Clk1 are counted during the falling slope Dw1 which gives a total of three counts as in the prior art implementation of the left side of FIG. 2a.

Consequently, the ramp signal Vramp enables a resolution which is comparable to the resolution when using a conventional ramp signal R. By way of the shift Rs1 of the ramp signal Vramp an extra bit of resolution is achieved compared with state of the art up-down ramps without shift.

The shift Rs1 of the ramp signal Vramp on the right side of FIG. 2a is realized by phase shifting the ramp signal Vramp with respect to the main clock signal Clk1. The adjustable shift Rs1 here amounts to half a period of the clock signal Clk1.

FIG. 2b shows details of the ramp signal Vramp according to an embodiment.

As an alternative to the right side of FIG. 2a the shift of the ramp signal Vramp in this example is achieved by shifting a phase of the main clock signal Clk1. In detail, at the ramp shift Rs1 the main clock signal Clk1 is delayed by half a period.

Figure 3:
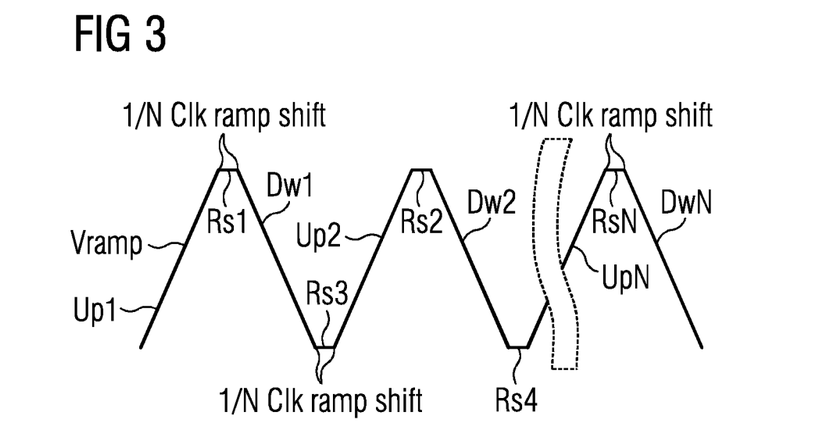
FIG. 3 shows an exemplary timing diagram of a ramp signal according to an embodiment of the proposed ADC circuit and method.

FIG. 3 shows an exemplary timing diagram of a ramp signal according to an embodiment of the proposed ADC circuit and method. The ramp signal Vramp has N linearly rising portions Up1, Up2, . . . , UpN and N linearly falling portions Dw1, Dw2, . . . , DwN. At each reversal point between the rising and the falling portion Up1, Dw1 the ramp signal Vramp has a shift Rs1, Rs2, . . . , RsN. Furthermore, at each reversal point between a falling portion and a rising portion Dw1, Up2 the ramp signal Vramp also has a shift Rs3, RS4. Each shift Rs1, Rs2, Rs3, Rs4, . . . , RsN is a function of the reciprocal value of N. Therein, N is an even integer, for example four, in order to avoid a ramp reset at the end of a full conversion cycle comprising N rising portions and N falling portions. The oversampling when using a ramp signal Vramp with N updown slopes ideally becomes N.

The ramp signal Vramp of FIG. 3 can be employed in the first and second mode of the ADC circuit.

Figure 4A:
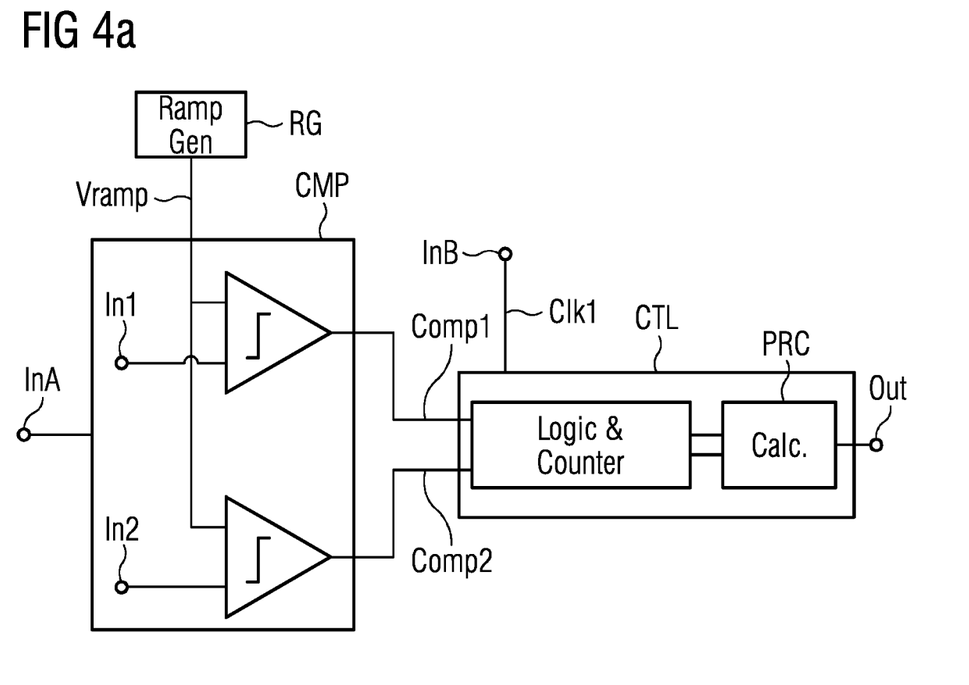
FIG. 4a shows a second embodiment example of the proposed ADC circuit.

FIG. 4a shows a second embodiment example of the proposed ADC circuit. The ADC circuit of FIG. 4A corresponds to the ADC circuit of FIG. 1A except for the realization of the comparison unit CMP and the realization of the control unit CTL. According to FIG. 4a the comparison unit CMP comprises two comparators, each of which receives the ramp signal Vramp. The input InA is adapted for concurrently receiving the first and the second analog signal level In1, In2 which are separately provided to the upper and the lower comparator. Consequently, the upper comparator receives the first analog signal level In1 and the ramp signal Vramp and provides a first comparing signal Comp1 depending on the comparison of the ramp signal Vramp with the first analog signal level In1. The lower comparator receives the second analog signal level In2 and the ramp signal Vramp and provides a second comparing signal Comp2 depending on the comparison of the second analog signal level In2 with the ramp signal Vramp. First and second comparing signal Comp1, Comp2 are provided to the control unit CTL.

The ADC circuit according to the embodiment of FIG. 4A is operated in the second mode as defined above. The comparison of first and second analog signal levels In1, In2 with the ramp signal Vramp is performed concurrently. Detailed operation of the ADC circuit is explained in the following with reference to FIGS. 4B and 4C.

Figure 4B:
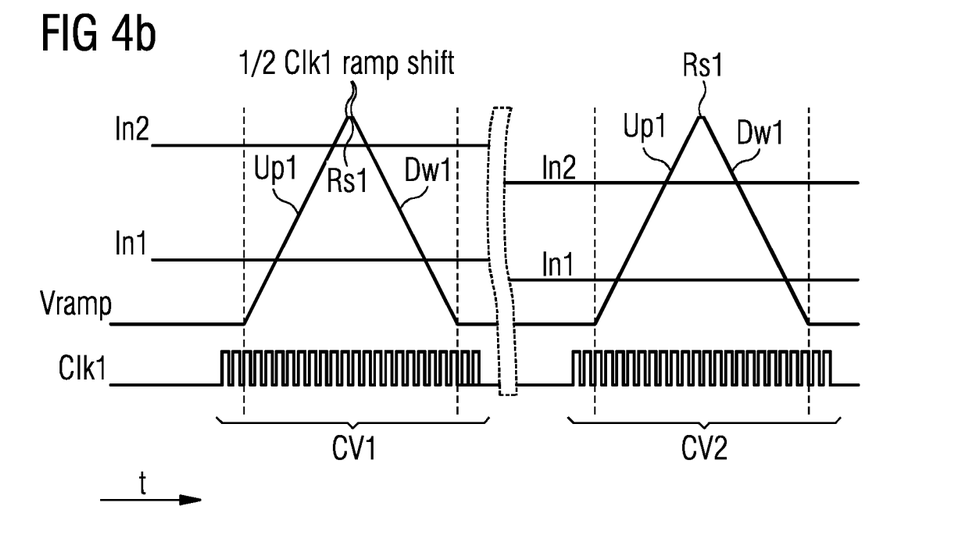

FIG. 4B shows an exemplary timing diagram for the proposed ADC circuit of FIG. 4A. From top to bottom the course of the second analog signal level In2, the first analog signal level In1, the ramp signal Vramp and the main clock signal Clk1 are depicted with respect to time t. A first full conversion cycle CV1 is shown on the left-hand side, while on the right side a second full conversion cycle CV2 is shown. Each conversion cycle CV1, CV2 comprises one linearly rising portion Up1 and one linearly falling portion Dw1. At the reversal point between the rising portion Up1 and the falling portion Dw1 the ramp signal Vramp has a shift Rs1 of half a clock period of the main clock signal Clk1. The level of the first and the second analog signal level In1, In2 used in the second conversion cycle CV2 on the right-hand side respectively differs from the level of the first and the second analog signal level In1, In2 of the first conversion cycle CV1 on the left-hand side.

Figure 4C:
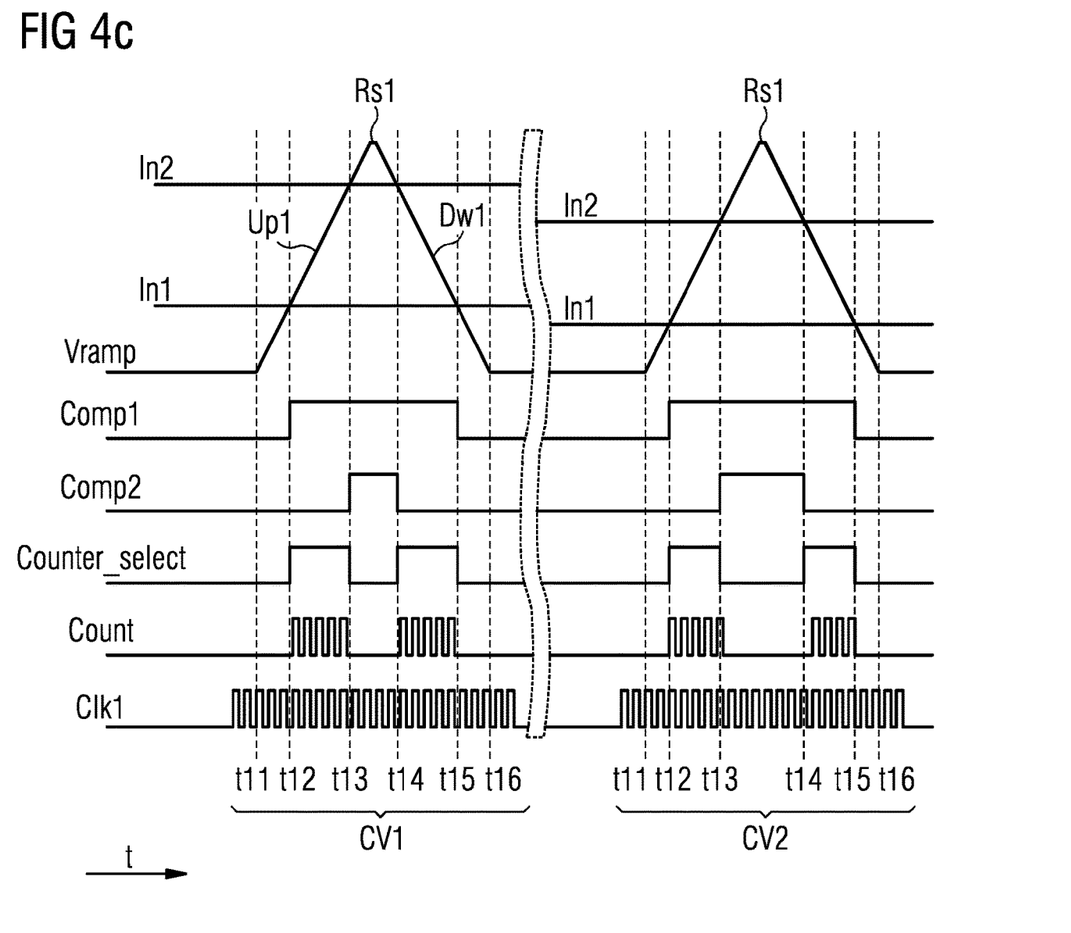

FIG. 4c shows exemplary timing diagrams for the proposed ADC circuit of FIG. 4a. FIG. 4c corresponds to FIG. 4b and additionally shows in more detail the first and the second comparing signal Comp1, Comp2, the Counter_select signal and the counting signal Count during the first and the second conversion cycle CV1, CV2 of FIG. 4b.

At point in time t11 the ramp signal Vramp starts with its first rising portion Up1. At point in time t12 the ramp signal Vramp reaches the level of the first analog signal level In1 and consequently the upper counter of the comparing unit CMP of FIG. 4A toggles such that the first comparing signal Comp1 goes to high. The counter of the control unit CTL is activated by the Counter_select signal and the counting signal Count provides counts according to the main clock signal Clk1.

At point in time t13 the ramp signal Vramp during its rising portion Up1 reaches the level of the second analog signal level In2. As a consequence, the output of the lower comparator of the comparing unit CMP of FIG. 4A toggles and the second comparing signal Comp2 goes to high. The Counter_select signal is set to low which disables the counter. Then the ramp shift Rs1 occurs and the ramp signal Vramp decreases in its falling portion Dw1.

During the falling portion Dw1 at point in time t14 the ramp signal Vramp again reaches the level of the second analog signal level In2 which implies toggling of the output of the lower comparator of the comparison unit CMP of FIG. 4A such that the second comparing signal Comp2 goes back to low. The Counter_select signal is set to high which activates the counter of the control unit CTL. At point in time t15 the ramp signal Vramp with its falling portion Dw1 again reaches the level of the first analog signal level In1. The output of the upper comparator of the comparison unit CMP in FIG. 4A toggles and the first comparing signal Comp1 goes back to low level. The counter is deactivated by the Counter_select signal. At point in time t16 the ramp signal Vramp ends. A full conversion cycle therefore extends between the point in time t11 and the point in time t16.

The output digital value determined in the first conversion cycle CV1 is directly provided as the difference between the first and the second analog signal level In1, In2 identified by the counting signal Count.

At the next point in time t11 the second conversion cycle CV2 starts. At the end of the second conversion cycle CV2 at point in time t16 the difference between the first and the second analog signal level In1, In2 provided to the ADC circuit in the second conversion cycle CV2 is provided as a function of the counting signal Count.

In this embodiment the concept of the second mode is shown with a ramp signal Vramp having one rising portion Up1 and one falling portion Dw1 which can be called a ramp signal with a dual slope. In alternative implementations it is also possible to use a ramp signal Vramp with multiple rising and multiple falling portions as depicted in FIG. 2b in a single conversion cycle. In such a case the ramp shift Rs1 is adapted to the reciprocal value of a number of up and down slopes.

Figure 5A:
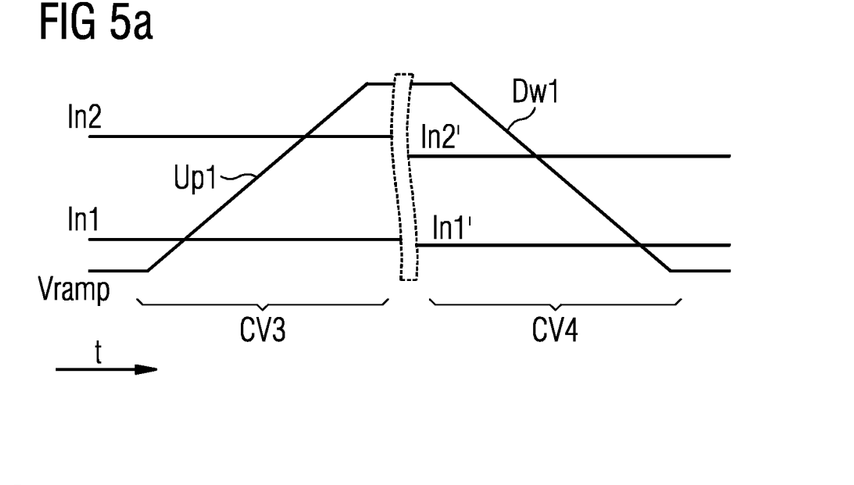

FIG. 5a shows exemplary timing diagrams for the proposed ADC circuit of FIG. 4a. The circuit of FIG. 4a in this case is operated in the third mode as defined above. A third conversion cycle CV3 is depicted on the left-hand side, while the right-hand side shows a fourth conversion cycle CV4.

The third conversion cycle CV3 comprises exactly one linearly rising portion Up1. The fourth conversion cycle CV4 comprises exactly one portion Dw1. In other words, in each conversion cycle CV3, CV4 a single slope of the ramp signal Vramp is used. To avoid the time and power-consuming ramp reset known from the state of the art, each consecutive conversion starts from the end of the ramp signal's value of the previous conversion. In this case this signifies that in the fourth conversion cycle CV4 the ramp signal Vramp starts at basically the same level at which the ramp signal Vramp of the third conversion cycle CV3 ended. The direction of the slope, i.e. the rising or the falling portion of the ramp signal Vramp, is inverted after each conversion cycle. As the gradients of the slopes are mainly equal, the start and end points of the ramp signal Vramp will not drift.

Figure 5B:
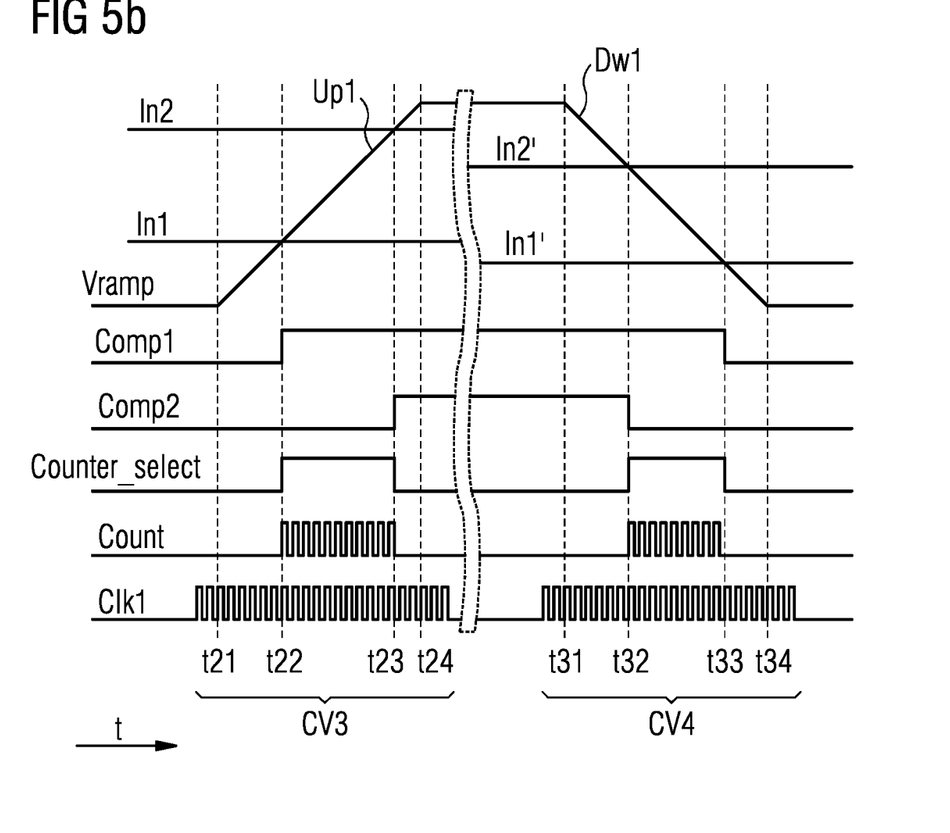

FIG. 5b shows exemplary timing diagrams for the proposed ADC circuit of FIG. 4a. The timing diagrams correspond to the diagrams of FIG. 5a, wherein FIG. 5b shows in more detail the first and second comparing signals Comp1, Comp2, the Counter_select signal and the counting signal Count in the third and the fourth conversion cycle CV3, CV4 of FIG. 5A. The third conversion cycle CV3 starts at point in time t21 with the rising portion Up1 of the ramp signal Vramp. At point in time t22 the ramp signal Vramp reaches the level of the first analog signal level In1 and the output of the upper comparator of the comparison unit CMP of FIG. 4a toggles such that the first comparing signal Comp1 goes to high. This activates the counter by the Counter_select signal and the counting signal Count is provided. At point in time t23 the ramp signal Vramp reaches the level of the second analog signal level In2 and consequently the output of the lower comparator of the comparison unit CMP in FIG. 4a toggles. The second comparing signal Comp2 goes to high level. As a consequence, the counter is disabled by the Counter_select signal. At point in time t24 the third conversion cycle CV3 ends and the output digital value is directly provided as the number of clock signals of the main clock signal Clk1 provided by the counting signal Count which reflects the difference between the first and the second analog signal levels In1, In2.

At point in time t31 the next conversion starts in the fourth conversion cycle CV4. At the beginning of the fourth conversion cycle CV4 first and second comparing signals Comp1, Comp2, the control signal Counter_select start from the same level that was achieved in the previous conversion cycle CV3. The ramp signal Vramp decreases from the level at the end of the previous, i.e. here the third conversion cycle CV3, at point in time t24 in the falling portion Dw1. At point in time t32 the ramp signal Vramp reaches the level of the second analog input signal In2. The output of the lower comparator of the comparing unit CMP in FIG. 4a toggles and the second comparing signal Comp2 goes back to low. The counter is activated by the Counter_select signal and consequently provides the counting signal Count. At point in time t33 the ramp signal Vramp reaches the level of the first analog signal level In1. The output of the upper comparator of the comparison unit CMP in FIG. 4a toggles and the first comparing signal Comp1 goes back to low level. The counter is deactivated by the Counter_select signal and stops providing the counting signal Count. The fourth conversion cycle Cv4 ends at point in time t34 at which the output digital value is directly provided as the number of clocks of the main clock signal Clk1 determined with the counting signal Count.

Since the described operation in the third mode converts the difference between the first and the second analog signal levels In1, In2, the exact starting voltage of the ramp signal Vramp is not important. It is therefore not necessary to reset the ramp signal Vramp to an exact reference value each time. A coarse ramp reset can be done to avoid reference drift.

Figure 6A:
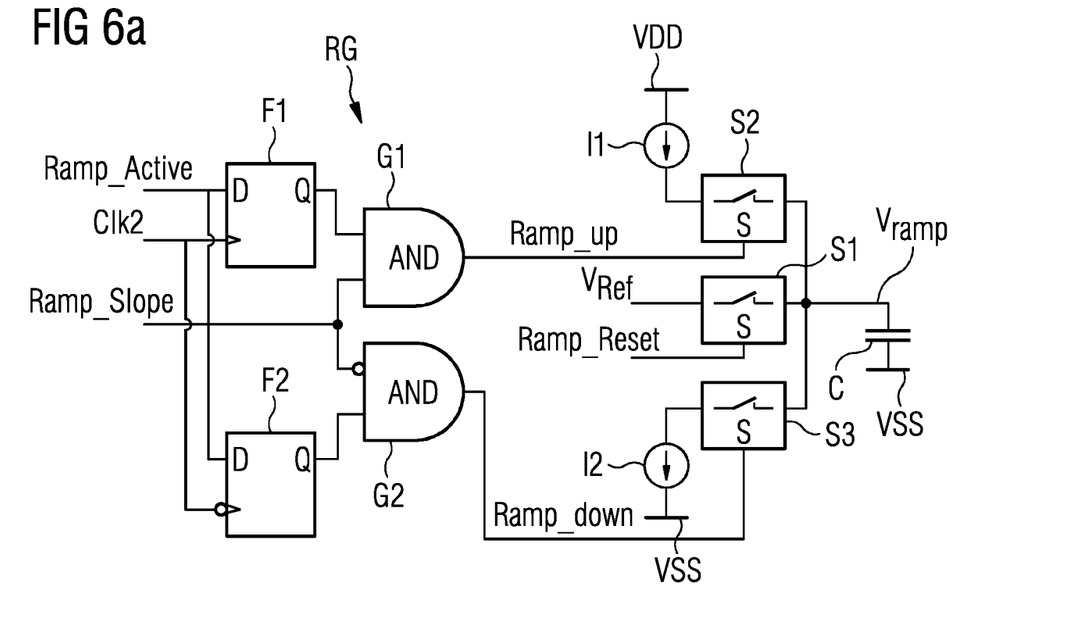
FIG. 6a shows an embodiment example of the ramp generator of the proposed ADC circuit.

FIG. 6a shows an embodiment example of the ramp generator of the proposed ADC circuit. The depicted ramp generator RG can be used with the first or the second embodiment example of the proposed ADC circuit as described above with respect to FIGS. 1a and 4a. The ramp generator RG comprises a first and a second flip-flop F1, F2, a first and a second logic gate G1, G2 which respectively realize the logic and function, a first and a second current source I1, I2, a first, a second and a third switch S1, S2, S3 and a capacitor C. The ramp generator RG is controlled by the control unit CTL as of FIG. 1a or FIG. 4a by the control signals Ramp_Active, Ramp_Slope and Ramp_Reset. The ramp generator RG receives a secondary clock signal Clk2 which is derived from the main clock signal Clk1. The secondary clock signal Clk2 has a frequency which is an integer multiple of the frequency of the main clock signal Clk1. Therein, the integer multiple is a function of the adjustable shift of the ramp signal Vramp.

First and second flip-flops F1, F2 are respectively realized as D flip-flops. The first flip-flop F1 receives the Ramp_Active signal at its D input and the secondary clock signal Clk2 at its clock input. The second flip-flop F2 receives the Ramp_Active signal at its D input and the secondary clock signal Clk2 in its inverted form at its clock input. The Q output of the first flip-flop F1 is supplied to the first AND gate G1. The Q output of the second flip-flop F2 is supplied to the second gate G2. The first gate G1 further receives the Ramp_Slope signal at its second input and provides a Ramp_Up signal at its output. The second gate G2 receives the Ramp_Slope signal in its inverted form at its second input and provides a Ramp_Down signal at its output. The Ramp_Up signal controls the second switch S2. The Ramp_Down signal controls the third switch S3. The Ramp_Reset signal controls the first switch S1. The capacitor C is coupled between a ramp node 10 and a negative supply voltage VSS. The ramp signal Vramp is provided at the ramp node 10, for example as a voltage.

The ramp generator RG is operated in different phases by first, second and third switches S1, S2, S3. While the first switch S1 is active, the ramp node 10 is connected to a reference potential Vref. This initializes the ramp signal Vramp before each conversion cycle.

Next, the second switch S2 is activated. This causes current to flow from a positive supply voltage VDD and the first current source I1 to the ramp node and the capacitor C. The voltage on the ramp node 10 consequently increases linearly. This realizes the rising portion of the ramp signal Vramp. Activation of the second switch S2 lasts for a configurable number of clock periods of the secondary clock signal Clk2.

Subsequently, the second switch S2 is deactivated. Since there is no current flowing to or from the ramp node 10, the voltage on the capacitor C representing the ramp signal Vramp stays constant. In the next phase the third switch S3 is activated on the opposite clock edge of the secondary clock signal Clk2 compared to the activation of the second switch S2. This causes current to flow from the ramp node 10 via the second current source I2 to a reference or ground potential VSS. The voltage on the ramp node 10 decreases which realizes the falling portion of the ramp signal Vramp. After the same number of clock cycles as used during the previous phase while the second switch S2 was activated, the third switch S3 is deactivated. The ramp generator RG is then controlled in the reset phase again by the control unit.

Figure 6B:
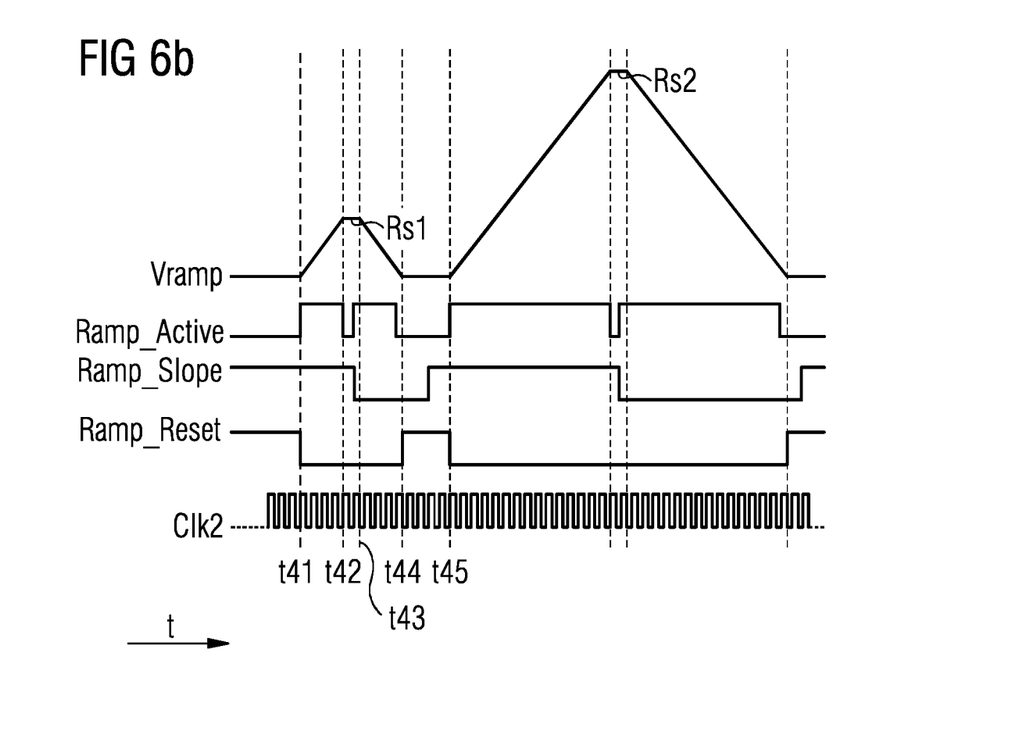

FIG. 6b shows exemplary timing diagrams for the ramp generator of FIG. 6a. From top to bottom the ramp signal Vramp, and the control signals Ramp_Active, Ramp_Slope and Ramp_Reset, as well as the secondary clock signal Clk2 are depicted with respect to time t.

At the beginning, by way of the Ramp_Reset signal the voltage of the ramp signal Vramp is set to the reference voltage Vref which is between the supply voltage VDD and the lower supply or ground potential VSS. At point in time t41 the Ramp_Reset signal is set to low by which the first switch S1 is opened. Upon occurrence of a high level of the Ramp_Active and the Ramp_Slope signal, the first gate G1 provides a high output in the form of the Ramp_Up signal which closes the second switch S2. The ramp signal Vramp rises linearly until the point in time t42.

At point in time t42 the Ramp_Active signal is controlled to low, such that the output of the first gate G1 goes to low and the second switch S2 is opened. As all three switches S1, S2, S3 are open, the level of the ramp signal Vramp stays constant. At half a clock period before point in time t43 the signal Ramp_Active is set to high level again, while the signal ramp Ramp_Slope is set to low level. The result of this control propagates at the falling edge of the secondary clock signal Clk2 at point in time t43 by way of the second flip-flop F1 and the second gate G2 which outputs a high level for the Ramp_Down signal. This closes the third switch S3 and causes the ramp signal Vramp to decrease and realizes the falling portion.

Half a clock period before point in time t44 the Ramp_Active signal is set to low which causes second and third switches S2, S3 to open. At point in time t44 the first switch S1 is closed by way of the Ramp_Reset signal and the ramp signal Vramp is reset to the reference voltage Vref. Another rising and falling portion of the ramp signal Vramp may be realized subsequently with a different number of clocks of the secondary clock signal Clk2 being used for the rising and the falling portion of the ramp signal in order to realize a ramp shift Rs at a higher level of the ramp signal Vramp.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the ADC circuit and corresponding method which are defined in the accompanying claims.

The invention claimed is:

1. An analog-to-digital converter circuit having
   an input for receiving a first analog signal level and a second analog signal level,
   a ramp generator adapted to provide a ramp signal,
   a comparison unit coupled to the input and the ramp generator,
   a control unit coupled to the comparison unit the control unit having a counter, the control unit being prepared to enable the counter as a function of a comparison of the ramp signal with the first analog signal level and the second analog signal level, and
   an output for providing an output digital value as a function of a relationship between the first analog signal level and the second analog signal level,
   wherein the ramp signal has at least one linearly rising and at least one linearly falling portion and an adjustable shift at a reversal point between the rising and falling portion of the ramp signal, the shift depending on the number of rising and falling portions of the ramp signal.

2. The analog-to-digital converter circuit according to claim 1,
wherein the shift at the reversal point between the rising and falling portion of the ramp signal is realized by a delay during which the ramp signal remains at an essentially constant level, and a gradient of the rising portion of the ramp signal is substantially equal to a gradient of the falling portion of the ramp signal.

3. The analog-to-digital converter circuit according to claim 1,
wherein the converter circuit is operable in one of three modes,
wherein
in a first mode a conversion cycle comprises at least two linearly rising portions and at least two linearly falling portions of the ramp signal and a sequential comparison of the first analog signal level with the ramp signal and the second analog signal level with the ramp signal,
in a second mode a conversion cycle comprises one linearly rising portion and one linearly falling portion of the ramp signal and a concurrent comparison of the first analog signal level and the second analog signal level with the ramp signal, and
in a third mode a conversion cycle comprises one linearly rising portion or one linearly falling portion of the ramp signal and a concurrent comparison of the first analog signal level and the second analog signal level with the ramp signal and a subsequent conversion cycle starts at the reversal point of the rising or falling portion of the ramp signal after the shift.

4. The analog-to-digital converter circuit according to claim 3,
wherein in the first mode and in the second mode a conversion cycle comprises a number of N linearly rising portions and N linearly falling portions of the ramp signal,
wherein N is an even integer, and wherein each shift of the ramp signal is a function of the reciprocal value of N and wherein the shift is additionally inserted at each reversal point between the linearly falling and the linearly rising portion of the ramp signal.

5. The analog-to-digital converter circuit according to claim 1 or 2,
further comprising another input for receiving a main clock signal, the main clock signal being used by the counter, wherein the shift of the ramp signal is a function of a phase shift of the ramp signal with respect to the main clock signal, or the shift of the ramp signal is a function of a phase shift of the main clock signal.

6. The analog-to-digital converter circuit according to claim 1 or 2,
wherein the control unit further comprises a processing unit which is prepared to calculate the output digital value as a function of a counting signal provided by the counter.

7. The analog-to-digital converter circuit according to claim 1 or 2,
wherein the ramp generator additionally adapted to derive a secondary clock signal from the main clock signal, the secondary clock signal having a frequency which is an integer multiple of a frequency of the main clock signal, the integer multiple being a function of the adjustable shift of the ramp signal.

8. A method for analog-to-digital conversion comprising
supplying a first analog signal level and a second analog signal level,
generating a ramp signal,
comparing the ramp signal with the first analog signal level and the second analog signal level,
enabling a counting in function of the comparing the ramp signal with the first analog signal level and the second analog signal level, and
providing an output digital value as a function of a relationship between the first analog signal level and the second analog signal level,
wherein the ramp signal has at least one linearly rising and at least one linearly falling portion and an adjustable shift at a reversal point between the rising and falling portion of the ramp signal, the shift depending on the number of rising and falling portions of the ramp signal.

9. The method according to claim 8,
wherein the comparing the ramp signal with the first analog signal level and the second analog signal level is performed sequentially.

10. The method according to claim 8,
wherein the comparing the ramp signal with the first analog signal level and the second analog signal level is performed concurrently.

11. The method according to claim 8,
wherein the conversion is performed in one of three modes,
wherein
in a first mode a conversion cycle comprises at least two linearly rising portions and at least two linearly falling portions of the ramp signal and a sequential comparison of the first analog signal level with the ramp signal and the second analog signal level with the ramp signal is performed,
in a second mode a conversion cycle comprises one linearly rising portion and one linearly falling portion of the ramp signal and a concurrent comparison of the first analog signal level and the second analog signal level with the ramp signal is performed, and
in a third mode a conversion cycle comprises one linearly rising portion or one linearly falling portion of the ramp signal and a concurrent comparison of the first analog signal level and the second analog signal level with the ramp signal is performed and a subsequent conversion cycle starts at the reversal point of the rising or falling portion after the shift.

12. The method according to claim 11,
wherein in the first mode a conversion cycle comprises a number N linearly rising portions and N linearly falling portions of the ramp signal, wherein N is an even integer,
wherein each shift is a function of the reciprocal value of N, and wherein the shift is additionally inserted at each reversal point between the linearly falling and the linearly rising portion of the ramp signal.

* * * * *

UNITED STATES PATENT AND TRADEMARK OFFICE
CERTIFICATE OF CORRECTION

PATENT NO.        : 10,804,916 B2
APPLICATION NO.   : 16/494829
DATED             : October 13, 2020
INVENTOR(S)       : Adi Xhakoni et al.

Page 1 of 1

It is certified that error appears in the above-identified patent and that said Letters Patent is hereby corrected as shown below:

In the Claims

In Claim 7, the word "is" is missing in Line 61 of Column 13 between "generator" and "additionally".

Signed and Sealed this
Fifth Day of January, 2021

Andrei Iancu
*Director of the United States Patent and Trademark Office*